United States Patent
Yu et al.

(10) Patent No.: US 12,388,060 B2
(45) Date of Patent: Aug. 12, 2025

(54) INTEGRATED FAN-OUT PACKAGES AND METHODS OF FORMING THE SAME

(71) Applicant: Taiwan Semiconductor Manufacturing Co., Ltd., Hsinchu (TW)

(72) Inventors: Chen-Hua Yu, Hsinchu (TW); Kuo-Lung Pan, Hsinchu (TW); Ting-Hao Kuo, Hsinchu (TW); Hao-Yi Tsai, Hsinchu (TW); Hsiu-Jen Lin, Zhubei (TW); Hao-Jan Pei, Hsinchu (TW); Ching-Hua Hsieh, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 74 days.

(21) Appl. No.: 17/659,580

(22) Filed: Apr. 18, 2022

(65) Prior Publication Data
US 2022/0246590 A1    Aug. 4, 2022

Related U.S. Application Data

(63) Continuation of application No. 16/529,989, filed on Aug. 2, 2019, now Pat. No. 11,309,294.

(Continued)

(51) Int. Cl.
*H01L 25/065* (2023.01)
*H01L 21/48* (2006.01)
(Continued)

(52) U.S. Cl.
CPC ........ *H01L 25/105* (2013.01); *H01L 21/4853* (2013.01); *H01L 21/4857* (2013.01);
(Continued)

(58) Field of Classification Search
CPC ............. H01L 25/0652; H01L 25/0657; H01L 23/49822
See application file for complete search history.

(56) References Cited

U.S. PATENT DOCUMENTS 6,828,510 B1 *  12/2004  Asai ....................... H05K 3/423
                                                    174/262
8,993,380 B2     3/2015  Hou et al.
(Continued)

FOREIGN PATENT DOCUMENTS

| CN | 102270624 A | 12/2011 |
| CN | 203312275 U | 11/2013 |

(Continued)

*Primary Examiner* — Bryan R Junge
(74) *Attorney, Agent, or Firm* — Slater Matsil, LLP

(57) ABSTRACT

A method includes forming a composite material layer over a carrier, the composite material layer including particles of a filler material incorporated into a base material, forming a set of through vias over a first side of the composite material layer, attaching a die over the first side of the composite material layer, the die being spaced apart from the set of through vias, forming a molding material over the first side of the composite material layer, the molding material least laterally encapsulating the die and the through vias of the set of through vias, forming a redistribution structure over the die and the molding material, the redistribution structure electrically connected to the through vias, forming openings in a second side of the composite material layer opposite the first side, and forming conductive connectors in the openings, the conductive connectors electrically connected to the through vias.

20 Claims, 13 Drawing Sheets

Related U.S. Application Data

(60) Provisional application No. 62/727,311, filed on Sep. 5, 2018.

(51) Int. Cl.
  *H01L 21/56* (2006.01)
  *H01L 23/31* (2006.01)
  *H01L 23/498* (2006.01)
  *H01L 25/00* (2006.01)
  *H01L 25/10* (2006.01)

(52) U.S. Cl.
  CPC .......... *H01L 21/486* (2013.01); *H01L 21/561* (2013.01); *H01L 23/3128* (2013.01); *H01L 23/49822* (2013.01); *H01L 25/0657* (2013.01); *H01L 25/50* (2013.01); *H01L 2225/1058* (2013.01)

(56) References Cited

U.S. PATENT DOCUMENTS

| | | | |
|---|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,299,649 B2 | 3/2016 | Chiu et al. |
| 9,368,460 B2 | 6/2016 | Yu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,496,189 B2 | 11/2016 | Yu et al. |
| 9,666,502 B2 | 5/2017 | Chen et al. |
| 9,735,131 B2 | 8/2017 | Su et al. |
| 9,818,692 B2 | 11/2017 | Roberts et al. |
| 10,128,193 B2 | 11/2018 | Chen et al. |
| 10,163,802 B2 | 12/2018 | Lin et al. |
| 10,217,702 B2 | 2/2019 | Lin et al. |
| 10,541,226 B2 | 1/2020 | Yu et al. |
| 2008/0151522 A1* | 6/2008 | Sakamoto ............. H01L 21/568 361/783 |
| 2011/0042797 A1 | 2/2011 | Park et al. |
| 2011/0155433 A1* | 6/2011 | Funaya ............. H01L 23/49827 174/258 |
| 2011/0297425 A1 | 12/2011 | Nakamura et al. |
| 2011/0308849 A1 | 12/2011 | Kondo et al. |
| 2013/0001485 A1 | 1/2013 | Li et al. |
| 2013/0027895 A1 | 1/2013 | Hayashi |
| 2013/0175702 A1 | 7/2013 | Choi et al. |
| 2013/0341784 A1 | 12/2013 | Lin et al. |
| 2014/0159251 A1 | 6/2014 | Marimuthu et al. |
| 2014/0252646 A1 | 9/2014 | Hung et al. |
| 2015/0179616 A1 | 6/2015 | Lin et al. |
| 2015/0270232 A1* | 9/2015 | Chen ........................ H01L 25/10 257/691 |
| 2016/0351494 A1 | 12/2016 | Chen et al. |
| 2016/0372393 A1 | 12/2016 | Kasztelan et al. |
| 2016/0380090 A1 | 12/2016 | Roberts et al. |
| 2018/0076142 A1 | 3/2018 | Shim et al. |
| 2018/0077829 A1* | 3/2018 | Yamamoto ............. B32B 15/08 |
| 2018/0096941 A1 | 4/2018 | Kim et al. |
| 2018/0151500 A1 | 5/2018 | Chen et al. |
| 2018/0151502 A1 | 5/2018 | Lin et al. |

FOREIGN PATENT DOCUMENTS

| | | |
|---|---|---|
| CN | 103515252 A | 1/2014 |
| CN | 106257663 A | 12/2016 |
| CN | 108122858 A | 6/2018 |
| CN | 108122861 A | 6/2018 |
| DE | 102017117952 A1 | 3/2018 |
| TW | 201804589 A | 2/2018 |
| TW | 201820571 A | 6/2018 |
| TW | 201824488 A | 7/2018 |

* cited by examiner

INTEGRATED FAN-OUT PACKAGES AND METHODS OF FORMING THE SAME

PRIORITY CLAIM AND CROSS-REFERENCE

This application is a continuation application of U.S. patent application Ser. No. 16/529,989, filed on Aug. 2, 2019, which claims benefit of U.S. Provisional Patent Application No. 62/727,311 filed Sep. 5, 2018, entitled "InFO Structure for Package on Package Devices and Methods of Forming the Same," which applications are incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

An example of these packaging technologies is the Package-on-Package (POP) technology. In a PoP package, a top semiconductor packages is stacked on top of a bottom semiconductor package to allow high level of integration and component density. Another example is the Multi-Chip-Module (MCM) technology, where multiple semiconductor dies are packaged in one semiconductor package to provide semiconductor devices with integrated functionalities.

The high level of integration of advanced packaging technologies enables production of semiconductor devices with enhanced functionalities and small footprints, which is advantageous for small form factor devices such as mobile phones, tablets and digital music players. Another advantage is the shortened length of the conductive paths connecting the interoperating parts within the semiconductor package. This improves the electrical performance of the semiconductor device, since shorter routing of interconnections between circuits yields faster signal propagation and reduced noise and cross-talk.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of semiconductor packages and methods of forming the semiconductor packages, and in particular, integrated fan-out (InFO) semiconductor packages. A layer of a composite material that includes a filler material (e.g., particles) incorporated into a dielectric material (e.g., a polymer) is formed over a carrier, and then one or more semiconductor dies and/or conductive pillars are formed over the composite material. A molding material is formed over the carrier and around the dies and around the conductive pillars. A redistribution structure is formed over the molding material, the dies and the conductive pillars. In some cases, the use of a composite material layer can improve the structural rigidity of the semiconductor package. The layer of the composite material can also reduce warping or bending due to other layers such as those of the redistribution structure. Additionally, the layer of the composite material may have a rough or pitted surface which can improve adhesion of material subsequently deposited on the composite material.

Figure 1:
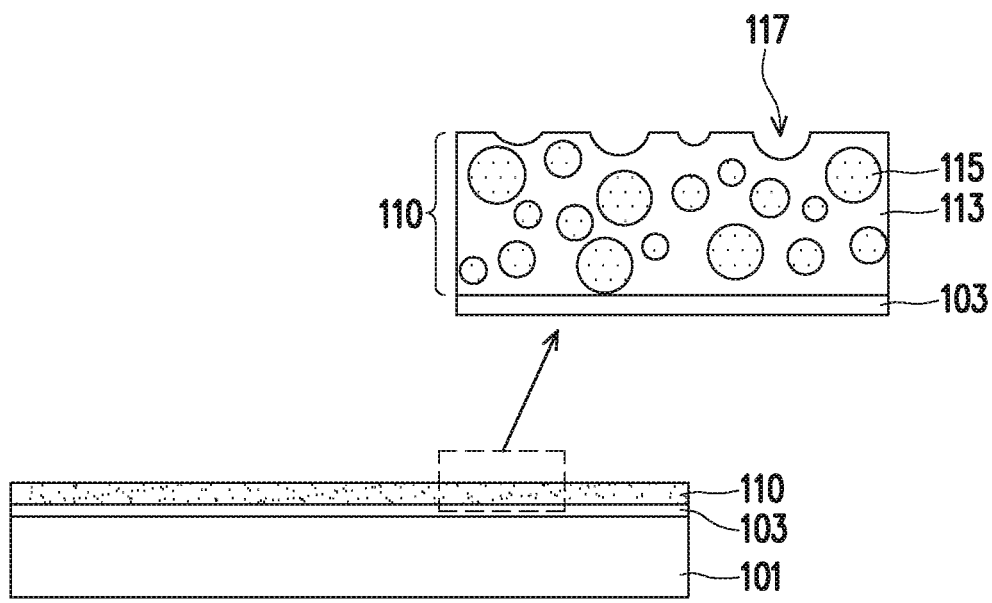
FIG. 1 illustrates a cross-sectional view of a composite layer in a semiconductor package at a stage of fabrication, in accordance with an embodiment.
Figure 14:
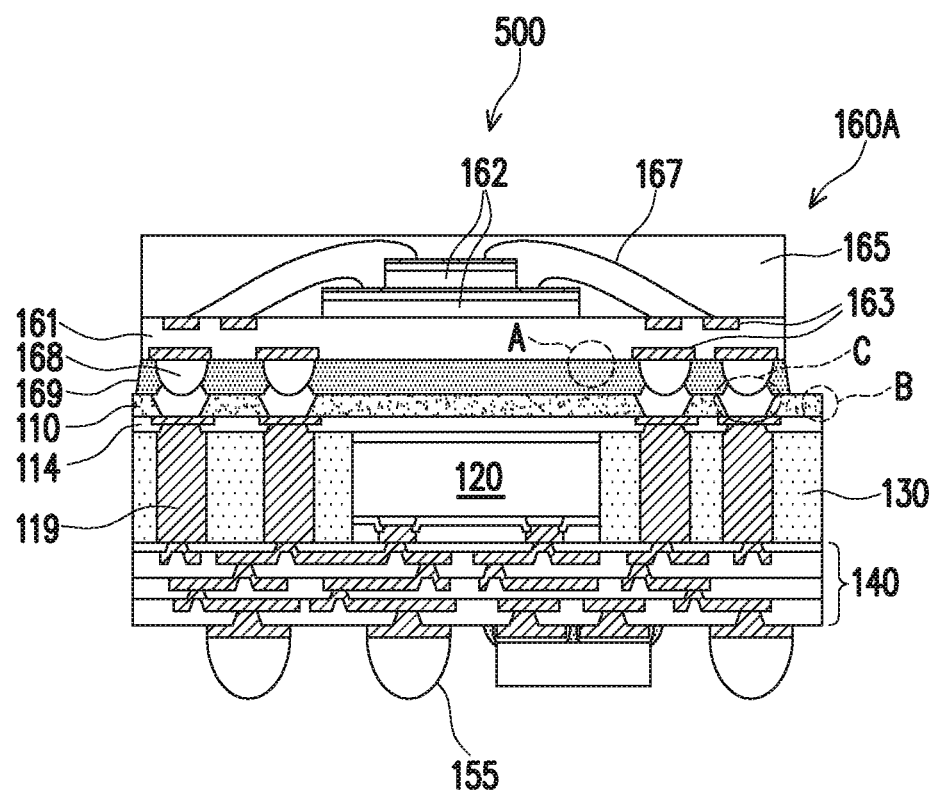
FIG. 14 illustrates a cross-sectional view of a semiconductor package, in accordance with an embodiment.
Figure 15A:
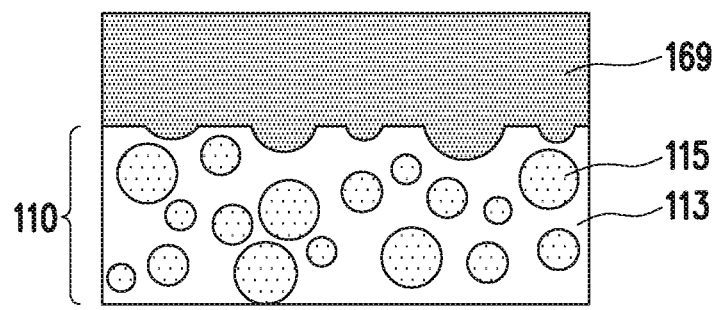
FIGS. 15A-D illustrate various views of composite layers in a semiconductor package at various stages of fabrication, in accordance with some embodiments.
Figure 15B:
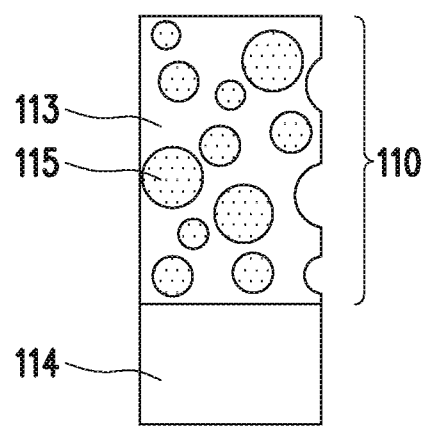
Figure 15C:
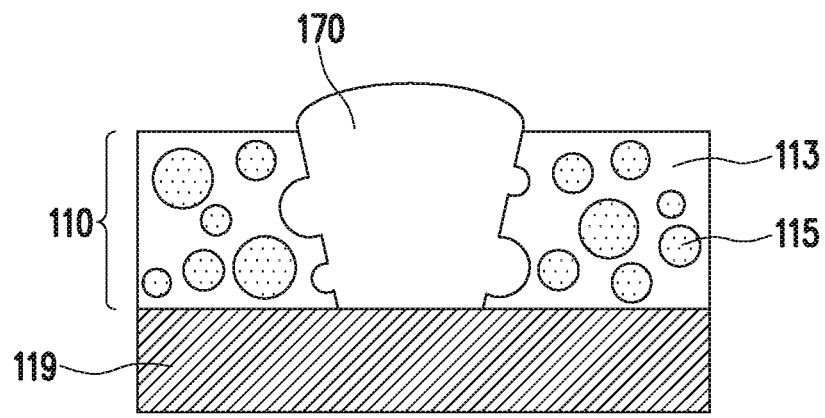
Figure 16:
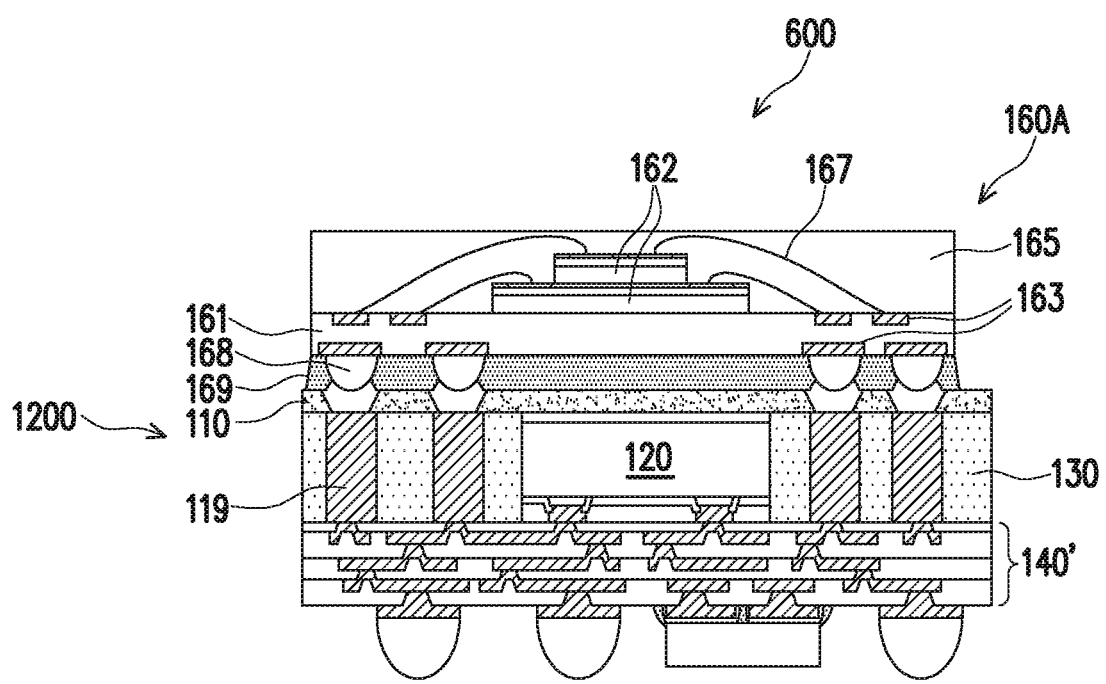
FIG. 16 illustrates a cross-sectional view of a semiconductor package, in accordance with an embodiment.

FIG. 1 illustrates a cross-sectional view of a composite layer 110 in a package structure 500 at a stage of fabrication, in accordance with an embodiment. FIGS. 2-13 illustrate cross-sectional views of the package structure 500 at various stages of fabrication, in accordance with an embodiment. FIG. 14 illustrates a cross-sectional view of the package structure 500, in accordance with an embodiment. FIGS. 15A-C illustrate various views of composite layers 100 in a package structure 500 at various stages of fabrication, in accordance with some embodiments. FIG. 16 illustrates a cross-sectional view of a package structure 600, in accordance with an embodiment.

Referring to FIG. 1, a release layer 103 and a composite layer 110 are formed over a carrier 101. The carrier 101 may be a wafer, a panel structure, or the like, and may be made of a material such as silicon, silicon oxide, aluminum, aluminum oxide, polymer, polymer composite, metal foil, ceramic, glass, glass epoxy, beryllium oxide, tape, the like, or a combination. The carrier 101 provides support for subsequently formed structures.

In some embodiments, a release layer 103 is deposited or laminated over the carrier 101 before the composite layer 110 is formed. The release layer 103 may be formed of a polymer-based material, which may be removed along with the carrier 101 from overlying structures formed in subsequent steps. In some embodiments, the release layer 103 is an epoxy-based thermal-release material, which loses its adhesive property when heated, such as a Light-to-Heat-Conversion (LTHC) release coating. In other embodiments, the release layer 103 may be a photosensitive material such as an ultra-violet (UV) glue, which loses its adhesive property when exposed to UV light. The release layer 103 may be dispensed as a liquid and cured, may be a laminate film laminated onto the carrier 101, or the like. The top surface of the release layer 103 may be leveled and may have a high degree of co-planarity.

Still referring to FIG. 1, the composite layer 110 is formed over the release layer 103. FIG. 1 also illustrates a magnified portion of the composite layer 110. In some embodiments, the composite layer 110 is a composite material including a filler material 115 incorporated within a base material 113. The filler material 115 may increase the mechanical strength or rigidity of the composite layer 110, described in greater detail below. The base material 113 may be a polymer, epoxy, resin, underfill material, a combination of materials, or the like.

The filler material 115 of the composite layer 110 may comprise particles, fibers, the like, or a combination. In some embodiments, the filler material 115 comprises particles of silicon oxide, aluminum oxide, the like, or a combination. In some embodiments, the particles have a diameter between about 0.5 μm and about 30 though the particles may have other diameters in other embodiments. In some embodiments, the filler material 115 of the composite layer 110 may be selected to have a particular range of diameters or to have an average diameter. For example, in some embodiments, the filler material 115 may be selected to have an average diameter of between about 0.5 μm and about 30 In some embodiments, the volume of filler material 115 within the composite layer 110 may be between about 30% and about 80% of the total volume of the composite layer 110. In some embodiments, the volume ratio of filler material 115 to base material 113 may be between about 0.5:1 and about 3:1. The characteristics of the filler material 115 may be selected to provide a particular characteristic to the composite layer 110, such as rigidity. For example, a composite layer 110 with filler material 115 of a larger average diameter may have more rigidity (e.g., a larger Young's modulus) than a composite layer 110 with filler material of a smaller average diameter. By using a material for the composite layer 110 that has a greater rigidity, the rigidity of the structure formed thereon (e.g., package structure 500 in FIG. 14) may be improved, and warping or bending of the structure may be reduced (described in greater detail below).

In some embodiments, the composite layer 110 is a composite polymer material, an underfill material, a molding compound, an epoxy, a resin, a combination of materials, or the like. In some embodiments, the composite layer 110 may have a coefficient of thermal expansion (CTE) that is greater than about 10 ppm/° C., such as about 22 ppm/° C. In some embodiments, the composite layer 110 may have a Young's modulus greater than about 10 GPa, such as about 23 GPa. In some embodiments, the composite layer 110 may have a thickness between about 10 μm and about 100 μm, such as about 35 μm. The composite layer 110 may be formed over the carrier 101 using a suitable deposition process, such as spin coating, chemical vapor deposition (CVD), laminating, the like, or a combination thereof. In some embodiments, the composite layer 110 is cured after deposition using a curing process. The curing process may comprise heating the composite layer 110 to a predetermined temperature for a predetermined period of time, using an anneal process or other heating process. The curing process may also comprise an ultra-violet (UV) light exposure process, an infrared (IR) energy exposure process, combinations thereof, or a combination thereof with a heating process. Alternatively, the composite layer 110 may be cured using other techniques. In some embodiments, a curing process is not included.

In some cases, one or more surfaces of the composite layer 110 may be pitted, and as such include pits 117, as shown in FIG. 1. The pits 117 may be caused by, for example, exposed pieces of the filler material 115 becoming dislodged or otherwise removed from the base material 113, leaving behind pits 117 where the pieces of filler material 115 had been previously located. For example, exposed pieces of the filler material 115 may become dislodged during a subsequent cleaning process or during another subsequent process step. In some cases, some of the pits 117 may have a size (e.g., diameter or depth) approximately equal to or less than the size (e.g., diameter) of the filler material 115. For example, some of the pits 117 may have a diameter or depth between about 0.5 μm and about 30 μm, in some embodiments. However, in some cases some pits 117 may have a size less than the size of the filler material 115 or a size greater than that of the filler material 115. In some cases, the presence of the pits 117 may improve adhesion of overlying layers, such as the dielectric layer 114 shown in FIG. 3. In some cases, the presence of pits 117 may cause a surface of the composite layer 110 to have a roughness between about 0.1 μm and about 10 μm. In some cases, the pits 117 may cover between about 50% and about 90% of a surface of the composite layer 110.

Figure 2:
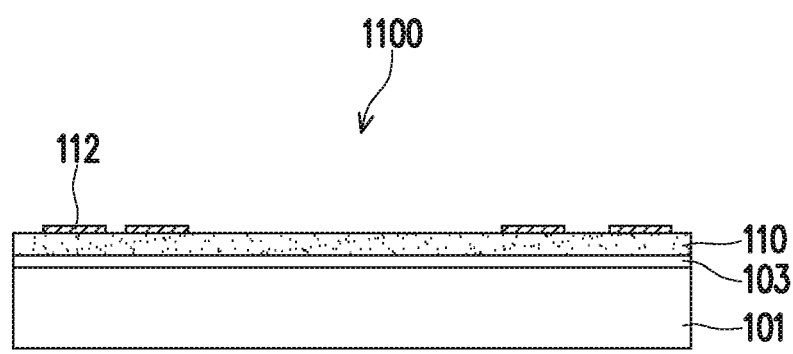
FIGS. 2-13 illustrate cross-sectional views of a semiconductor package at various stages of fabrication, in accordance with an embodiment.

Turning to FIG. 2, a metallization pattern 112 is formed on the composite layer 110. In some embodiments, the metallization pattern 112 is formed by forming a seed layer (not shown) over the composite layer 110. The seed layer may be a metal layer or another type of layer, and may include one or more layers of one or more different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 112. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, a combination, or the like. Then, the photoresist and portions of the seed layer on which the conductive material is not formed are removed. The photoresist may be removed by an acceptable ashing or stripping process, such as using an oxygen plasma or the like. In some embodiments, once the photoresist is removed, exposed portions of the seed layer are removed using an etching process, such as a wet etching process or a dry etching process. The remaining portions of the seed layer and conductive material form the metallization pattern 112.

Figure 3:
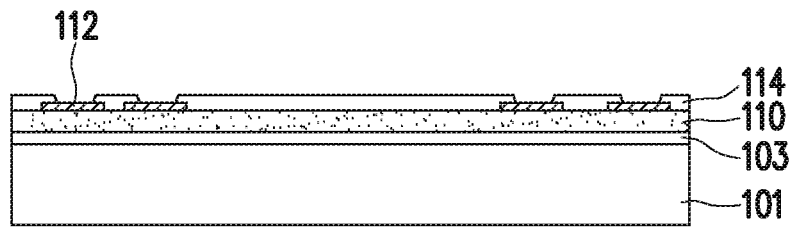

FIG. 3, a dielectric layer 114 is formed on the metallization pattern 112 and the composite layer 110. In some embodiments, the dielectric layer 114 is formed of a polymer, which may be a photo-sensitive material such as PBO, polyimide, BCB, or the like, that may be patterned using a lithography mask. In other embodiments, the dielectric layer 114 is formed of a nitride such as silicon nitride, an oxide such as silicon oxide, PSG, BSG, BPSG, or the like. The dielectric layer 114 may be formed by spin coating, lamination, CVD, the like, or a combination thereof. The dielectric layer 114 is patterned to expose portions of the metallization pattern 112. The dielectric layer 114 may be patterned using an acceptable process, such as by exposing the dielectric layer 114 to light when the dielectric layer 114 is a photo-sensitive material. In some embodiments, the dielectric layer 114 may be patterned using an etching mask and a suitable etching process such as an anisotropic etching process. In some embodiments, additional metallization patterns and dielectric layers may be formed in a stack over the metallization pattern 112 and dielectric layer 114, using similar techniques.

Figure 4:
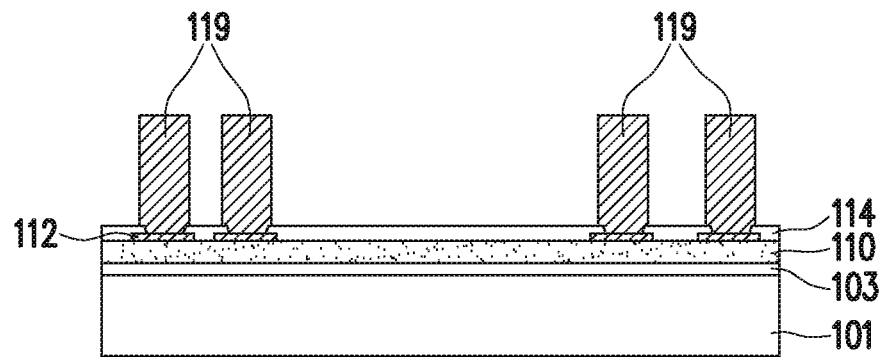

Turning to FIG. 4, through vias 119 are formed over the metallization pattern 112 and the dielectric layer 114. In some embodiments, the through vias 119 may be formed by forming a seed layer over the dielectric layer 114 and then forming a patterned photoresist over the seed layer, where each of the openings in the patterned photoresist corresponds to a location of the through via 119 to be formed. The openings in the dielectric layer 114 are filled with an electrically conductive material such as copper using a suitable technique such as electroplating or electroless plating. The photoresist is then removed using a suitable process such as an ashing or a stripping process. Portions of the seed layer on which the through vias 119 are not formed may then be removed using a suitable etching process. The through vias 119 may be formed as conductive pillars extending above the metallization pattern 112 and the dielectric layer 114. Other techniques for forming the through vias 119 are also possible and are fully intended to be included within the scope of the present disclosure.

Figure 5:
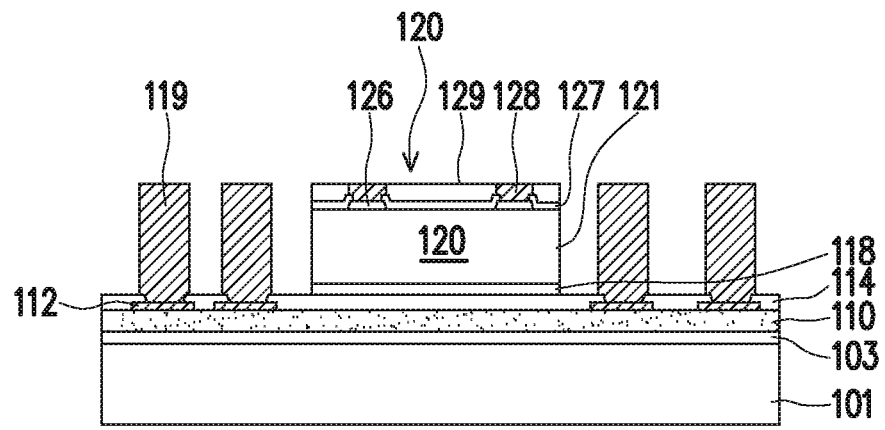

Next, in FIG. 5, a semiconductor die 120 (may also be referred to a die, or an integrated circuit (IC) die) is attached to the upper surface of the dielectric layer 114. An adhesive film 118, such as a die attach film (DAF), may be used to attach the die 120 to the dielectric layer 114. The die 120 may be attached using a suitable process such as a pick-and-place process. In some embodiments, the DAF may be cured after the die 120 is attached.

Before being adhered to the dielectric layer 114, the die 120 may be processed according to applicable manufacturing processes to form integrated circuits in the die 120. For example, the die 120 may include a semiconductor substrate and one or more overlying metallization layers, collectively illustrated in FIG. 5 as element 121. The semiconductor substrate may be, for example, doped or undoped silicon, or an active layer of a semiconductor-on-insulator (SOI) substrate. The semiconductor substrate may include other semiconductor materials such as germanium, a compound semiconductor including silicon carbide, gallium arsenic, gallium phosphide, gallium nitride, indium phosphide, indium arsenide, and/or indium antimonide, an alloy semiconductor including SiGe, GaAsP, AlInAs, AlGaAs, GaInAs, GaInP, and/or GaInAsP, combinations thereof, or the like. Other substrates such as multi-layered or gradient substrates may also be used. The die 120 may include devices (not shown), such as transistors, diodes, capacitors, resistors, etc., that are formed in and/or on the semiconductor substrate and may be interconnected by the metallization layers to form an integrated circuit. The metallization layers may include metallization patterns in one or more dielectric layers over the semiconductor substrate (e.g., as a redistribution structure).

The die 120 further comprises pads 126 (e.g., contact pads, aluminum pads, or the like) to which external connections may be made. The pads 126 may be located on the front side (e.g., the "active side") of the die 120. A passivation film 127 may be formed over the front side of the die 120 and on portions of the pads 126. Openings may be formed extending through the passivation film 127 to the pads 126. Die connectors 128 extend into the openings of the passivation film 127 and are mechanically and electrically coupled to the respective pads 126. The die connectors 128 may be, for example, conductive pads or conductive pillars. The die connectors 128 may comprise one or more conductive materials such as copper, and may be formed using a suitable process such as plating. The die connectors 128 are electrically coupled to devices and/or integrated circuits of the die 120.

A dielectric material 129 may be formed at the active sides of the die 120, such as on the passivation film 127 and/or the die connectors 128. The dielectric material 129 laterally encapsulates the die connectors 128, and the dielectric material 129 is laterally coterminous with the die 120. The dielectric material 129 may be a polymer such as polybenzoxazole (PBO), polyimide, benzocyclobutene (BCB), a nitride such as silicon nitride or the like, an oxide such as silicon oxide, phosphosilicate glass (PSG), borosilicate glass (BSG), boron-doped phosphosilicate glass (BPSG), a combination, or the like. The dielectric material 129 may be formed, for example, by spin coating, lamination, CVD, or the like.

Figure 6:
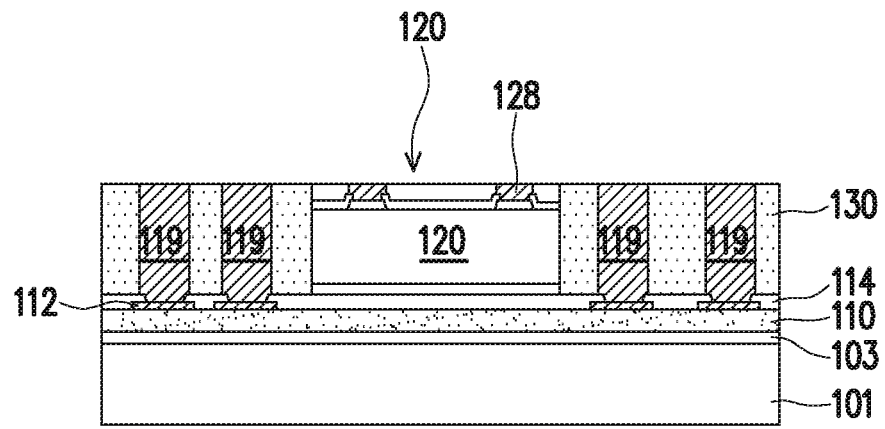

Next, in FIG. 6, a molding material 130 is formed over the dielectric layer 114. The molding material laterally surrounds the die 120 and laterally surrounds the through vias 119, separating the through vias 119 from the die 120 and from each other. The molding material 130 may comprise an epoxy, an organic polymer, a polymer with or without a silica-based or glass filler added, or other materials, as examples. In some embodiments, the molding material 130 comprises a liquid molding compound (LMC) that is a gel type liquid when applied. The molding material 130 may also comprise a liquid or solid when applied. Alternatively, the molding material 130 may comprise other insulating or encapsulating materials. The molding material 130 is applied using a wafer level molding process in some embodiments. The molding material 130 may be molded using, for example, compressive molding, transfer molding, or other techniques.

In some embodiments, the molding material 130 may be cured using a curing process. The curing process may comprise heating the molding material 130 to a predetermined temperature for a predetermined period of time, using an anneal process or other heating process. The curing process may also comprise an ultra-violet (UV) light exposure process, an infrared (IR) energy exposure process, combinations thereof, or the like. Alternatively, the molding material 130 may be cured using other techniques. In some embodiments, a curing process is not preformed.

Still referring to FIG. 6, a planarization process, such as chemical-mechanical polish (CMP), may optionally be performed to remove excess portions of the molding material 130 over the front side of the die 120. After the planarization process, the molding material 130, the through vias 119, and the die connectors 128 may have top surfaces that are coplanar.

Figure 7:
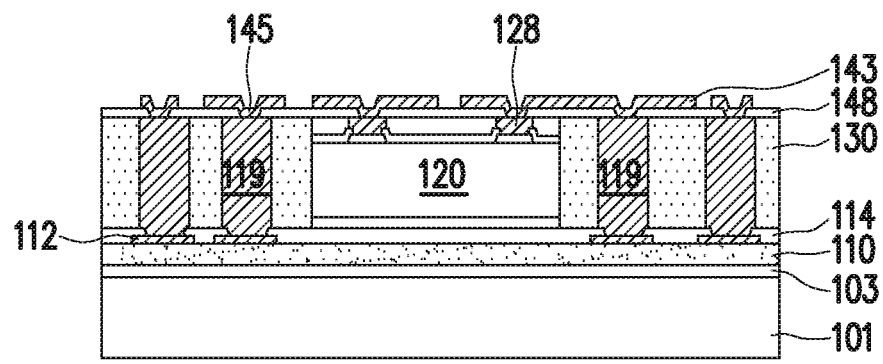
Figure 8:
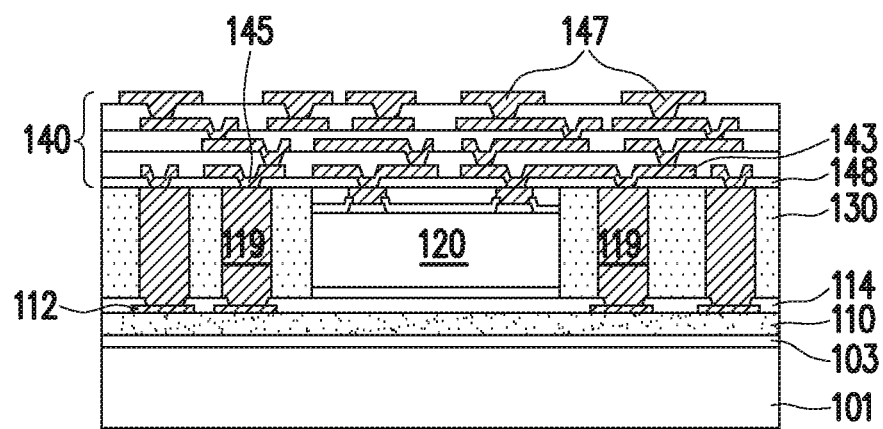

Referring next to FIG. 7 and FIG. 8, a redistribution structure 140 is formed over the molding material 130, the through vias 119, and the front side of the die 120, in accordance with some embodiments. The redistribution structure 140 comprises one or more layers of electrically conductive features (e.g., metallization patterns including conductive lines 143, vias 145, and the like) formed in one or more dielectric layer (e.g., dielectric layer 148).

In some embodiments, the one or more dielectric layers (e.g., dielectric layer 148) are formed of a polymer, such as polybenzoxazole (PBO), polyimide, benzocyclobutene (BCB), a photo-sensitive polymer, or the like. In some embodiments, the one or more of the dielectric layers may include other materials such as a nitride (e.g., silicon nitride), an oxide (e.g., silicon oxide), phosphosilicate glass (PSG), borosilicate glass (BSG), boron-doped phosphosilicate glass (BPSG), or the like. The one or more dielectric layers may be formed by a suitable deposition process, such as spin coating, chemical vapor deposition (CVD), laminating, the like, or a combination thereof.

In FIG. 7, the dielectric layer 148 is formed over the molding material 130, the through vias 119, and the front side of the die 120, and then patterned. The patterning forms openings to expose portions of the through vias 119 and the die connectors 128 of the die 120. The dielectric layer 148 may be patterned using an acceptable process, such as by exposing the dielectric layer 148 to light when the dielectric layer 148 is a photo-sensitive material and developing the dielectric layer 148 after the exposure to form the openings. The dielectric layer 148 may also be patterned by etching using, for example, an anisotropic etch.

Still referring to FIG. 7, a metallization pattern including conductive lines 143 and vias 145 is formed on the dielectric layer 148. In some embodiments, a seed layer (not shown) is first formed over the dielectric layer 148 and in openings through the dielectric layer 148. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. After forming the conductive material, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, for example using an acceptable etching process, such as a wet etching process or a dry etching process. The remaining portions of the seed layer and conductive material form the conductive lines 143 and vias 145. The vias 145 are formed in openings through the dielectric layer 148 to make electrical connection to features under the dielectric layer, such as to the through vias 119 and/or the die connectors 128.

Turning to FIG. 8, additional dielectric layers (not individually labelled) and additional conductive features (not individually labelled) may be formed over dielectric layer 148 and conductive lines 143, forming the redistribution structure 140. The additional dielectric layers may be similar to the dielectric layer 148, and the additional conductive features may be similar to the conductive lines 143 and vias 145. The additional dielectric layers or additional conductive features may be formed similarly to the dielectric layer 148 or conductive lines 143 and vias 145. For example, conductive features may be formed by forming openings in a dielectric layer of the redistribution structure 140 to expose underlying conductive features, forming a seed layer (not shown) over the dielectric layer and in the openings, forming a patterned photoresist (not shown) with a designed pattern over the seed layer, plating (e.g., electroplating or electroless plating) the conductive material in the designed pattern and over the seed layer, and removing the photoresist and portions of seed layer on which the conductive material is not formed. Other methods of forming the redistribution structure 140 are also possible and are fully intended to be included within the scope of the present disclosure.

The number of dielectric layers and the number of layers of the conductive features in the redistribution structure 140 of FIG. 8 are merely non-limiting examples. Other numbers of the dielectric layers and other numbers of layers of the conductive features are also possible and are fully intended to be included within the scope of the present disclosure.

FIG. 8 also illustrates under bump metallization (UBM) structures 147 formed over and electrically coupled to the redistribution structure 140. In some embodiments, the UBM structures 147 are formed by first forming openings in the topmost dielectric layer of the redistribution structure 140 to expose conductive features (e.g., conductive lines or pads) of the redistribution structure 140. After the openings are formed, the UBM structures 147 may be formed in electrical contact with the exposed conductive features. In an embodiment, the UBM structures 147 comprise three layers of conductive materials, such as a layer of titanium, a layer of copper, and a layer of nickel. However, there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBM structures 147. Any suitable materials or layers of material that may be used for the UBM structures 147 are fully intended to be included within the scope of the present disclosure.

The UBM structures 147 may be formed by forming a seed layer over the topmost dielectric layer (e.g., 142) and along the interior of the openings in the topmost dielectric layer; forming a patterned mask layer (e.g., photoresist) over the seed layer; forming (e.g., by plating) the conductive material(s) in the openings of the patterned mask layer and over the seed layer; removing the mask layer and remove portions of the seed layer on which the conductive material(s) is not formed. Other methods for forming the UBM structures 147 are possible and are fully intended to be included within the scope of the present disclosure. Upper surfaces of the UBM structures 147 in FIG. 4 are illustrated to be planar merely as an example, the upper surfaces of the UBM structures 147 may not be planar. For example, portions (e.g., peripheral portions) of each UBM structure 147 may be formed over the topmost dielectric layer (e.g., 142), and other portions (e.g., center portions) of each UBM structure 147 may be formed conformally along sidewalls of the topmost dielectric layer exposed by a corresponding opening, as skilled artisans ready appreciate.

Figure 9:
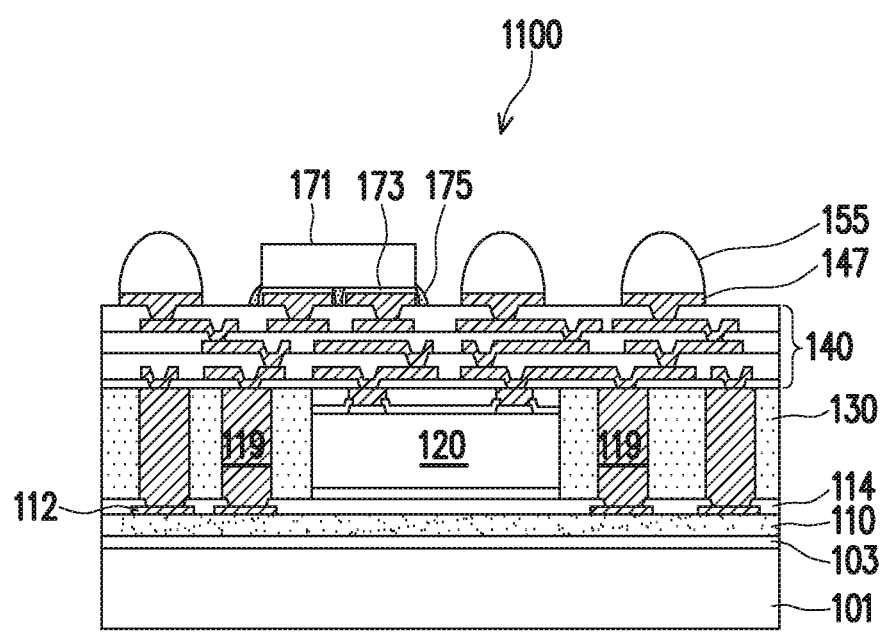

Next, in FIG. 9, an electrical device 171 is attached to UBM structures 147 and connectors 155 are formed over UBM structures 147, in accordance with some embodiments. The electrical device 171 may be a device, die, chip, or package, such as an integrated passive device (IPD) or the like. The electrical device 171 is electrically coupled to the redistribution structure 140 through the UBM structures 147 by conductive connectors 173. The conductive connectors 173 may be, for example, solder connectors formed between the electrical device 171 and redistribution structure 140. The conductive connectors 173 may comprise a same material (e.g., solder) as the connectors 155 (see below). In some embodiments, a flux material (not shown) may be deposited on the associated UBM structures 147 prior to placing the electrical device 171. The electrical device 171 may be placed using, e.g., a pick and place process. In addition, an underfill material 175 may be formed in a gap between the electrical device 171 and the redistribution structure 140. The electrical device 171 is optional, and may not be included in some embodiments.

Still referring to FIG. 9, the connectors 155 may be solder balls, metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. The connectors 155 may include a conductive material such as solder, copper, aluminum, gold, nickel, silver, palladium, tin, the like, or a combination thereof. In some embodiments, the connectors 155 comprise a eutectic material and may comprise a solder bump or a solder ball, as examples. The solder material may be, for example, lead-based and lead-free solders, such as Pb—Sn compositions for lead-based solder; lead-free solders including InSb; tin, silver, and copper (SAC) compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free connectors such as solder balls may be formed from SnCu compounds as well, without the use of silver (Ag). Alternatively, lead-free solder connectors may include tin and silver, Sn—Ag, without the use of copper. The connectors 155 may form a grid, such as a ball grid array (BGA). In some embodiments, a reflow process may be performed, giving the connectors 155 a shape of a partial sphere in some embodiments. In some cases, the reflow process may be performed on both the conductive connectors 173 and the connectors 155. Alternatively, the connectors 155 may comprise other shapes. The connectors 155 may also comprise non-spherical conductive connectors, for example. In some embodiments, a flux material (not shown) may be formed over the associated UBM structures 147 prior to forming the connectors 155.

In some embodiments, the connectors 155 comprise metal pillars (such as copper pillars), which may be formed by a sputtering, printing, electro plating, electroless plating, CVD, or the like, and may be formed with or without a solder material thereon. The metal pillars may be solder-free and have substantially vertical sidewalls or tapered sidewalls.

The structure shown in FIG. 9 is a single device package 1100 formed over the carrier 101. One skilled in the art will appreciate that many packages (e.g., device package 1100) may be formed over a carrier substrate (e.g., carrier 101) using similar processing steps as illustrated in FIGS. 1-9. FIGS. 10-14 illustrate further processing of the semiconductor package 1100 of FIG. 9 according to some embodiments. The processing of FIGS. 10-14 is shown using two device packages (e.g., 1100A and 1100B) formed over a carrier 101, with the understanding that more than two device packages may be formed over the carrier 101 in other embodiments.

Figure 10:
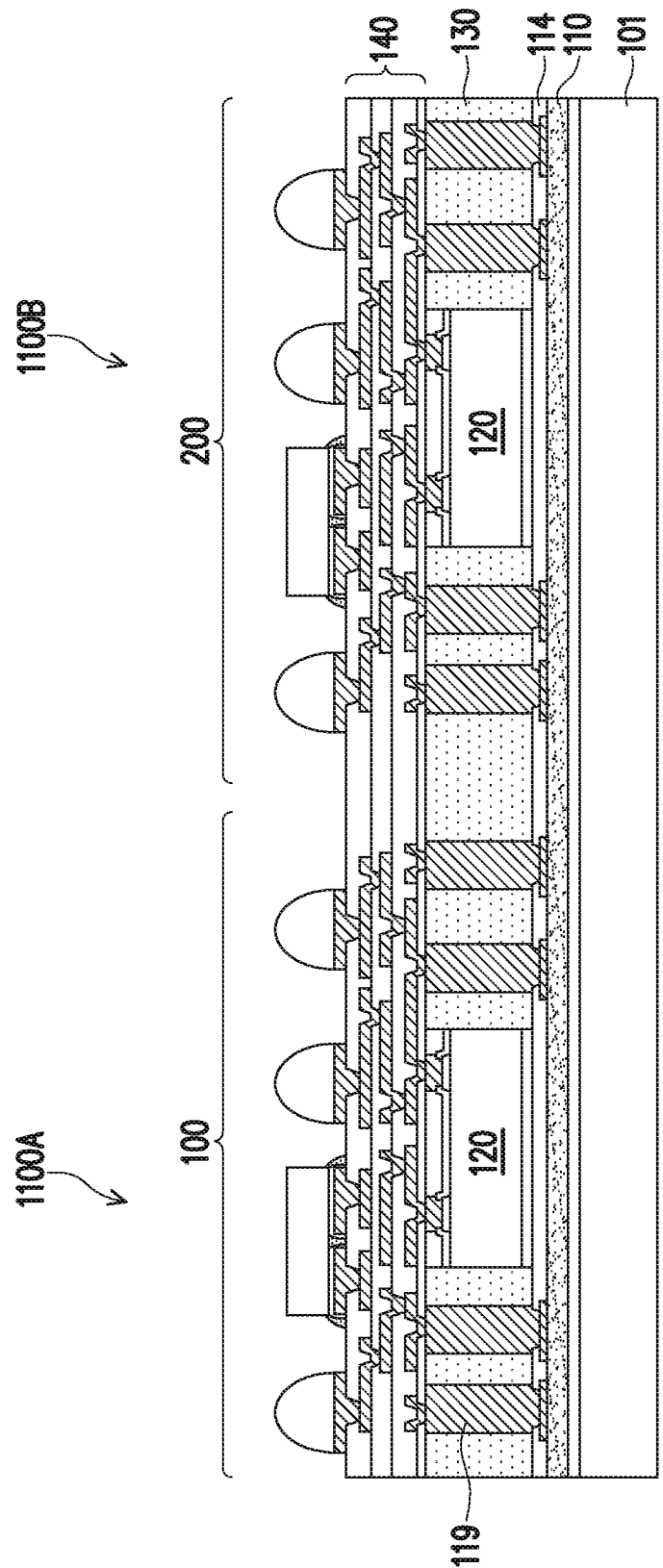

FIG. 10 illustrates a structure comprising a device package 1100A and a device package 1100B, in accordance with some embodiments. The device package 1100A and the device package 1100B are formed in regions 100 and 200 over the carrier 101, respectively. Each of the device packages 1100A and 1100B may be similar to the device package 1100 illustrated in FIG. 9.

Figure 11:
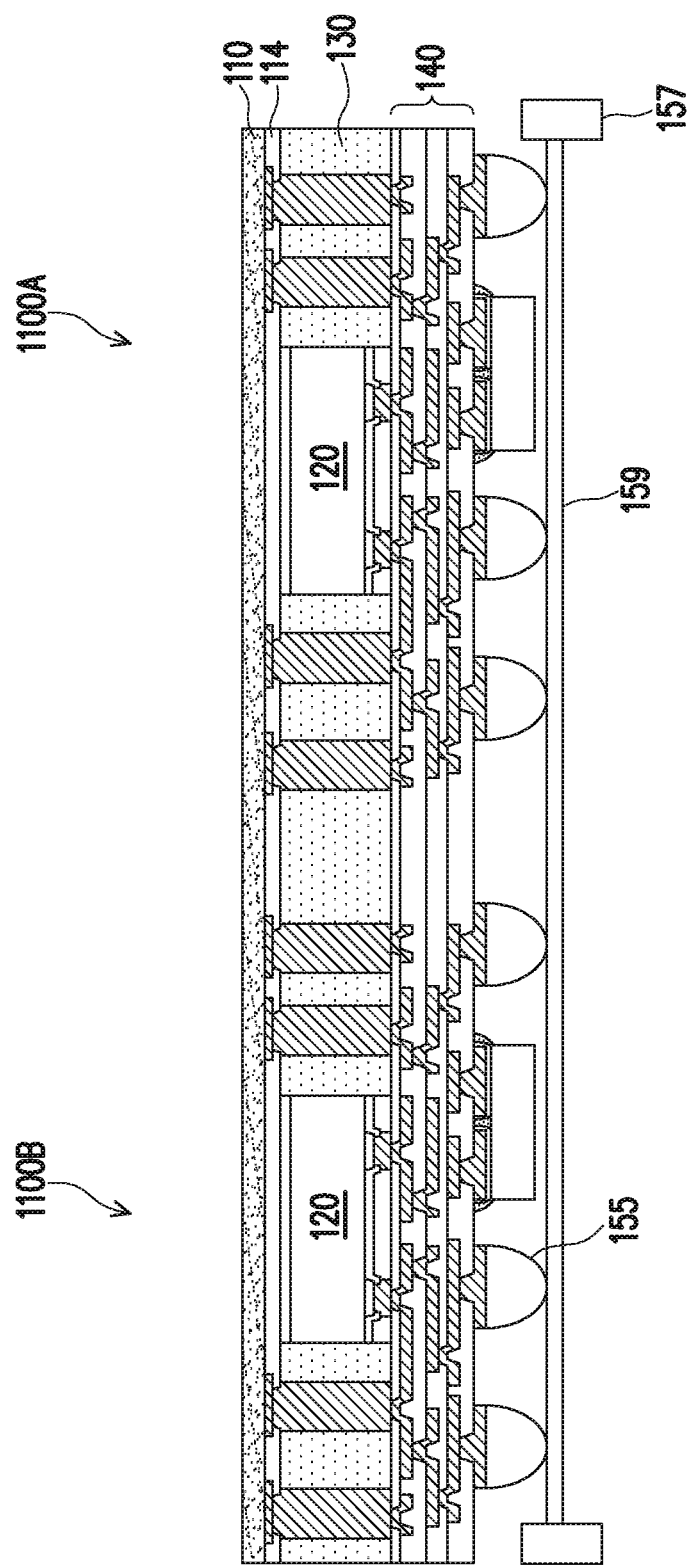

Turning to FIG. 11, the structure shown in FIG. 10 is flipped over, and the external connectors 155 are attached to a tape 159 (e.g., a dicing tape) supported by a frame 157, in accordance with some embodiments. Next, the carrier 101 is de-bonded from the composite layer 110 by a suitable process, such as etching, grinding, or mechanical peel off. In some embodiments in which an adhesive layer (e.g., an LTHC film) is formed between the carrier 101 and the composite layer 110, the carrier 101 may be de-bonded by exposing the carrier 101 to a laser or UV light. The laser or UV light breaks the chemical bonds of the adhesive layer that binds to the carrier 101, and the carrier 101 can then be detached. The adhesive layer may be removed by the carrier de-bonding process. After de-bonding the carrier 101, a cleaning process may be performed on the composite layer 110 to remove any residue (e.g., from the adhesive layer).

Figure 12:
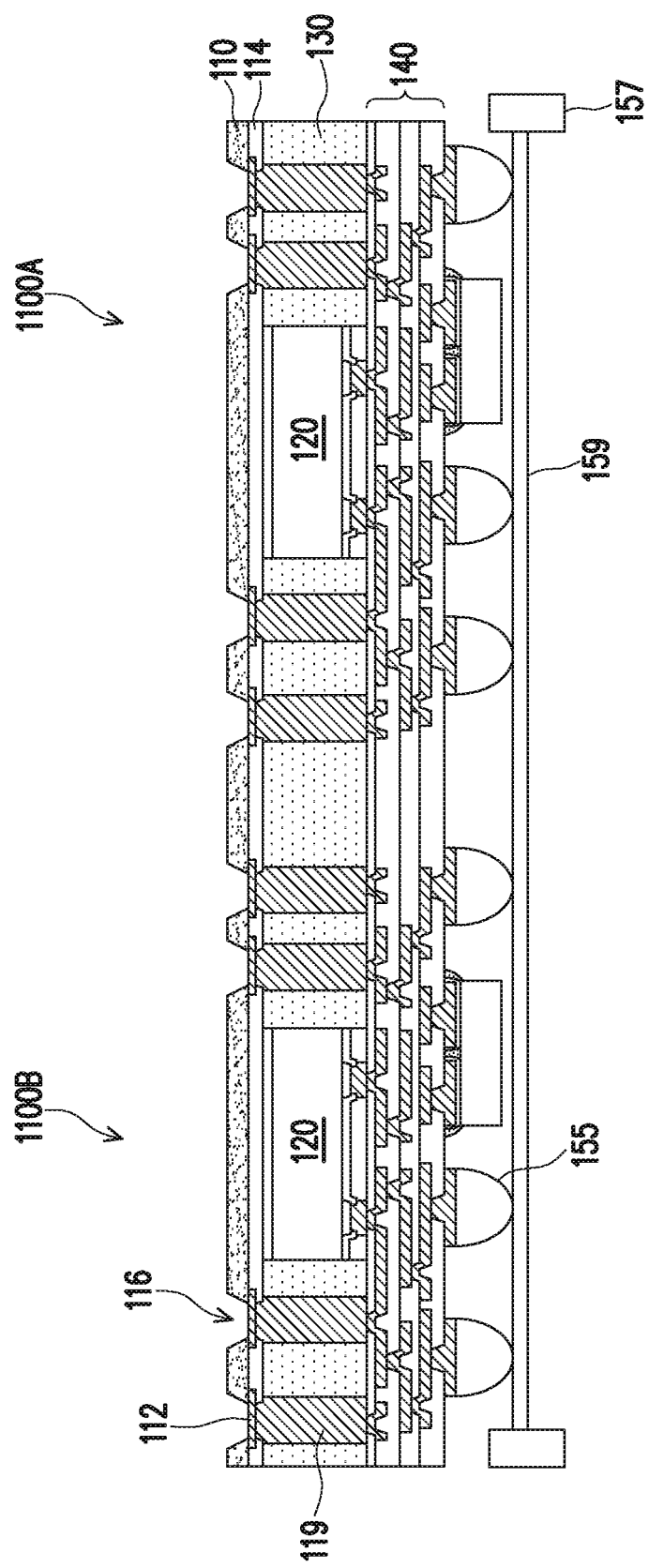

Turning to FIG. 12, after de-bonding the carrier 101, openings 116 are formed in the composite layer 110 to expose the metallization pattern 112, in accordance with some embodiments. In some embodiments, the openings 116 in the composite layer 110 may be formed using a suitable process such as a laser drilling process, an etching process, or the like. In some embodiments, the etching process is a plasma etching process. In some embodiments, a cleaning process is performed after forming the openings 116 in order to remove any residue (e.g., from a laser drilling process). Although not shown, solder paste may be formed in the openings 116 in preparation for attaching top packages (see FIG. 13). The solder paste may be formed using a solder paste printing process or another suitable process.

Figure 13:
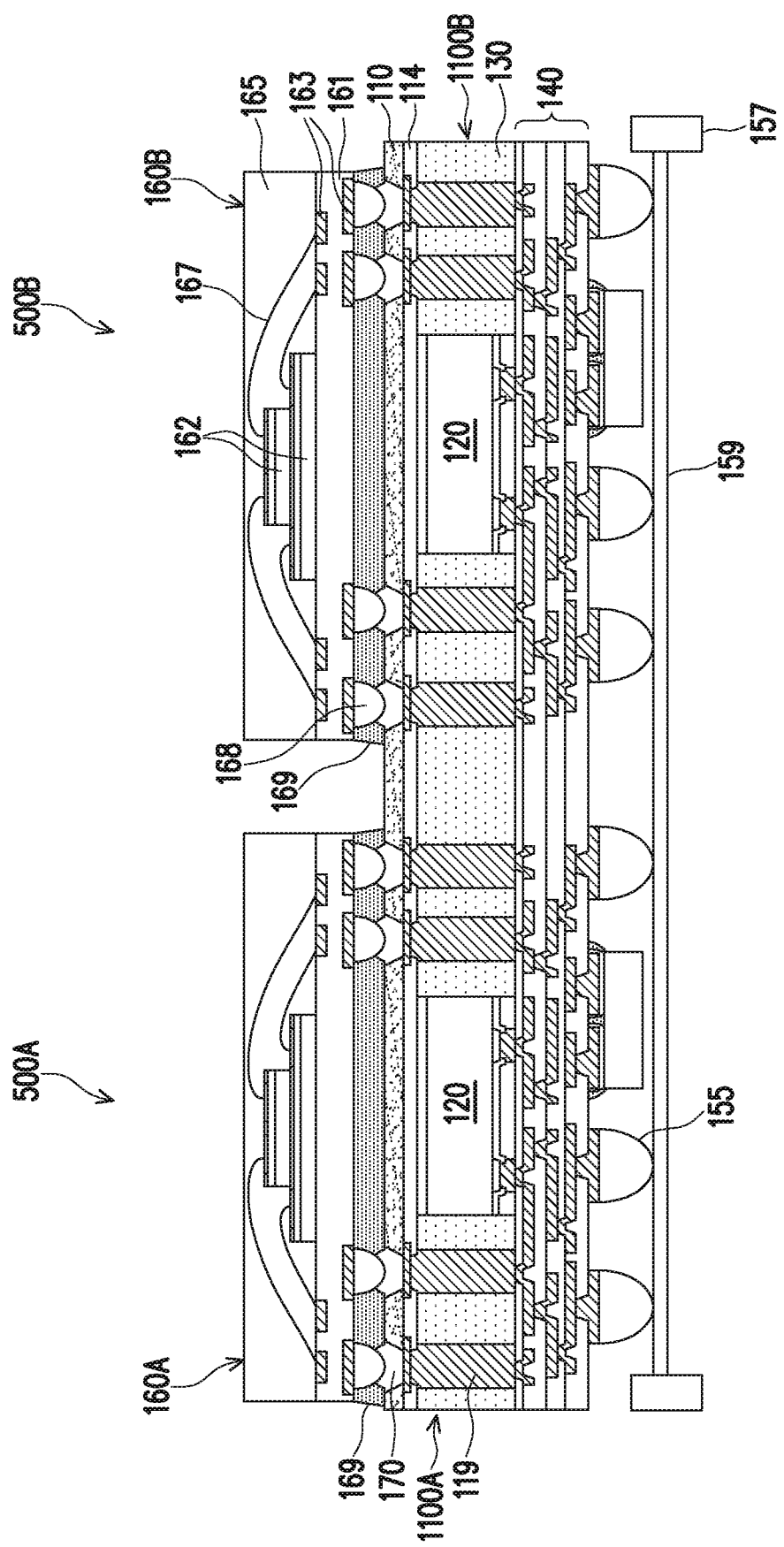

Referring next to FIG. 13, top packages 160 are attached to the device packages 1100 to form package structures 500, in accordance with some embodiments. In FIG. 13, example top packages 160A and 160B are shown attached to example device packages 1100A and 1100B to form example package structures 500A and 500B, respectively. In some embodiments, the package structures 500 may be package-on-package (PoP) or integrated fan-out (InFO-PoP) structures.

As illustrated in FIG. 13, each of the top packages 160 (e.g., 160A, 160B) comprises a substrate 161 and one or more semiconductor dies 162 (e.g., memory dies) attached to an upper surface of the substrate 161. In some embodiments, the substrate 161 includes silicon, gallium arsenide, silicon on insulator ("SOI"), the like, or a combination. In some embodiments, the substrate 161 is a multiple-layer circuit board. In some embodiments, the substrate 161 is formed from one or more materials such as bismaleimide triazine (BT) resin, FR-4 (a composite material composed of woven fiberglass cloth with an epoxy resin binder that is flame resistant), ceramic, glass, plastic, tape, film, or other supporting materials. The substrate 161 may include conductive features (e.g., conductive lines and vias, not shown) formed in or on the substrate 161. As illustrated in FIG. 13, the substrate 161 may have conductive pads 163 formed on the upper surface and a lower surface of the substrate 161. The conductive pads 163 are electrically coupled to the conductive features of the substrate 161, such as through vias or conductive lines. The one or more semiconductor dies 162 are electrically coupled to the conductive pads 163 by, e.g., bonding wires 167. A molding material 165, which may comprise an epoxy, an organic polymer, a polymer, encapsulant, or the like, is formed over the substrate 161 and around the semiconductor dies 162. In some embodiments, the molding material 165 is conterminous with the substrate 161, as illustrated in FIG. 13.

Still referring to FIG. 13, the top packages 160 may be connected to device packages 1100 by conductive connectors 168 on the conductive pads 163. The conductive connectors 168 make electrical connection between the metallization patterns 112 of the device packages 1100 and the conductive pads 163 of the top packages 160. In some embodiments, a solder material 170 is deposited over the metallization pattern 112 exposed through the openings in the composite layer 110. The conductive connectors 168 are attached to the solder material 170. In some embodiments, the conductive connectors 168 comprise solder regions, conductive pillars (e.g., copper pillars with solder regions on at least end surfaces of the copper pillars), or the like. In some embodiments, a reflow process is performed to bond the solder material 170 and the conductive connectors 168. After the reflow process, a baking process may be performed to remove moisture.

An underfill material 169 may then be formed in the gaps between the top packages 160 and the corresponding bottom packages 1100. The underfill material 169 may be dispensed into gaps between the top packages 160 and the device packages 1100 using, e.g., a needle or a jetting dispenser. In some embodiments, a curing process may be performed to cure the underfill material 169. Although not shown in FIG. 13, the underfill material 169 may extend between or along sidewalls of the top packages 160.

Next, in FIG. 14, a singulation process is performed to separate the package structures 500 (e.g., 500A, 500B) into a plurality of individual package structures. After the singulation process is finished, a plurality of individual package structures, such as the package structure 500 illustrated in FIG. 14, are formed. The singulation process may, for example, use a sawing process, a laser process, another suitable process, or a combination of processes.

In some cases, the use of a composite material for composite layer 110 (described previously with respect to FIG. 1) can provide for improved rigidity of a package such as package structure 500. The use of composite layer 110 in a package (e.g., package structure 500) may reduce warping of that package, such as reducing warping of the device structure 1100 and/or reducing warping of the entire package structure 500. For example, in some cases, a redistribution structure (e.g., redistribution structure 140) may impart bending forces on the package which cause the package to warp or bend. The rigidity of the composite layer 110 can mitigate the warping due to these bending forces, and thus reduce the overall warping of the package. In some cases, the use of a composite layer such as composite layer 110 may reduce the bending distance of a warped package between about 0 μm and about 250 μm. In some cases, the use of a composite layer 110 may allow the package structure to have a bending distance of less than about 200 μm, such as less than about 80 μm or less than about 10 μm. In some cases, the use of a composite layer such as composite layer 110 may reduce the warping of a package between about 50% and about 100%. In some embodiments, the reduction in warping may be improved by disposing the composite layer 110 and the redistribution structure 140 on opposite sides of the die 120.

Figure 15D:
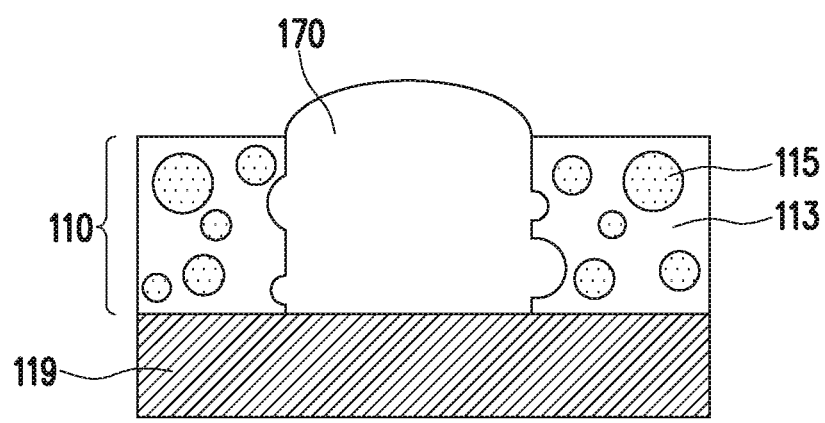

Turning to FIGS. 15A-D, illustrative close-up views of surfaces of the composite layer 110 are shown in accordance with some embodiments. FIG. 15A illustrates a close-up view of the region labeled "A" in FIG. 14, where the underfill material 169 has been deposited over the composite layer 110. As shown in FIG. 15A, the composite layer 110 has a pitted surface (also described above with respect to FIG. 1). The pitted surface of the composite layer 110 can provide improved adhesion of the underfill material 169, which can improve the overall rigidity of the package structure and reduce the chance of delamination. FIG. 15B illustrates a close-up view of the region labeled "B" in FIG. 14, which includes a sidewall of the composite layer 110. As shown in FIG. 15B, the sidewall of the composite layer 110 also has a pitted surface, which may improve adhesion of further materials deposited on the package structure 500 (e.g., molding compounds, encapsulants, or the like, which are not shown in the Figures). FIGS. 15C-D illustrate close-up views of the region labeled "C" in FIG. 14, which includes an opening in the composite layer 110 through which the solder material 170 extends (described previously with respect to FIG. 12). FIG. 15C shows the composite layer 110 with a tapered opening, and FIG. 15D shows a composite layer with a substantially vertical opening, though the openings may have other shapes in other embodiments. As shown in FIGS. 15C-D, the sidewalls of the openings may be pitted, and the solder material 170 may flow into the pits during deposition or during a reflow process. In this manner, the solder material 170 may have "bumps" corresponding to the pits in the sidewalls of the openings. In some cases, the pits can provide better adhesion of the solder material 170 to the composite layer 110. Additionally, in some cases, the increased volume of the solder material 170 within the opening due to the presence of pits can reduce the resistance of the solder material 170 and thus improve electrical performance of the package structure 500.

Referring next to FIG. 16, a package structure 600 is shown, in accordance with some embodiments. The package structure 600 includes a top package 160, which may be similar to top package 160 described previously (see FIG. 13). The top package 160 is attached to a device package 1200 to form package structure 600. The device package 1200 is similar to the device package 1100 described previously (see FIG. 9), except that the dielectric layer 114 and the metallization pattern 112 are not formed over the composite layer 110 (see FIG. 3). Thus, the through vias 119 and the molding material 130 are formed directly on the composite layer 110. Portions of the molding material 130 may extend into pits of the pitted surface of the composite layer 110. In some cases, the pitted surface of the composite layer 110 can provide improved adhesion of the molding material 130. These and other variations of forming a package structure with a composite layer 110 are intended to be within the scope of this disclosure.

Embodiments may achieve advantages. By forming a package having conductive elements (e.g., solder material 170) in a layer comprising a composite material (e.g., a polymer and filler), the rigidity of the package may be improved. In this manner, warping of the package may be reduced, and thus problems such as cracking or delamination associated with warping may be reduced. Additionally, the composite material may form a layer having pitted surfaces, which can improve adhesion of other layers to the composite material, thus further improving the reliability and stability of the package.

In an embodiment, a method includes forming a composite material layer over a carrier, the composite material layer including particles of a filler material incorporated into a base material, forming a set of through vias over a first side of the composite material layer, attaching a die over the first side of the composite material layer, the die being spaced apart from the set of through vias, forming a molding material over the first side of the composite material layer, the molding material least laterally encapsulating the die and the through vias of the set of through vias, forming a redistribution structure over the die and the molding material, the redistribution structure electrically connected to the through vias, forming openings in a second side of the composite material layer opposite the first side, and forming conductive connectors in the openings, the conductive connectors electrically connected to the through vias. In an embodiment, the particles of the filler material have an average diameter that is between 0.5 μm and 30 μm. In an embodiment, the base material includes a polymer. In an embodiment, the filler material includes an oxide. In an embodiment, the method includes forming a dielectric layer over the composite material layer, wherein the material of the dielectric layer is different than the material of the composite material layer, and wherein the set of through vias are formed on the dielectric layer. In an embodiment, the method includes forming a metallization pattern on the composite material layer before forming the dielectric layer on the composite material layer. In an embodiment, forming the openings in the second side of the composite material layer includes a laser drilling process. In an embodiment, the openings in the second side of the composite material layer have pitted sidewalls. In an embodiment, the conductive connectors include a solder material, wherein the sidewalls of the conductive connectors within the composite material layer include a plurality of bumps extending laterally into the composite material layer. In an embodiment, the molding material physically contacts the first side of the composite material layer. In an embodiment, the die is physically attached to the first side of the composite material layer.

In an embodiment, a method includes forming a device package, wherein forming the device package includes forming a metallization pattern on a first surface of a composite layer, wherein the composite layer includes a composite material and wherein the first surface is pitted, forming a first dielectric layer over the composite layer and the metallization pattern, forming a conductive pillar over the first dielectric layer and electrically connected to the metallization pattern, placing a first semiconductor device on the first dielectric layer, wherein the first semiconductor device is adjacent to and separated from the conductive pillar, encapsulating the first semiconductor device and the conductive pillar with an encapsulant, and forming a redistribution structure over the encapsulant, forming openings in a second surface of the composite layer to expose the metallization pattern, and attaching a top package to the device package using conductive connectors, wherein the conductive connectors extend through the openings in the composite layer. In an embodiment, the composite layer has a Young's modulus between 10 GPa and 50 GPa. In an embodiment, the method includes depositing an underfill between the device package and the top package, the underfill surrounding the conductive connectors, wherein the underfill extends into the pits of the pitted top surface of the composite layer. In an embodiment, the device package has a bending distance less than 80 μm. In an embodiment, the method includes singulating the device package, wherein a sidewall surface of the device package comprises a plurality of pits. In an embodiment, the composite layer includes aluminum oxide incorporated into a polymer material.

In an embodiment, a semiconductor package includes a lower package including a die on a redistribution structure, the die electrically connected to a redistribution structure, a through via proximate the die and electrically connected to the redistribution structure, a molding material over the redistribution structure, the molding material being interposed between the die and the through via, and a composite layer over the die and the through via, the composite layer over a side of the die opposite the redistribution structure, and a top package comprising external connections, wherein the external connections are connected to the lower package through the composite layer. In an embodiment, an exposed sidewall of the composite layer has a pitted surface. In an embodiment, the semiconductor package includes an underfill material extending between the composite layer and the top package, wherein an interface between the underfill material and the composite layer is a surface including pitted regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device comprising:
a redistribution structure comprising a first metallization pattern and a first dielectric layer over the first metallization pattern;
an integrated circuit die on the redistribution structure, wherein the integrated circuit die is electrically connected to the redistribution structure;
an encapsulant on the redistribution structure and surrounding the integrated circuit die, wherein the encapsulant physically contacts sidewalls of the integrated circuit die;
a conductive feature extending through the encapsulant, wherein the conductive feature is electrically connected to the redistribution structure;
a polymer material extending over the integrated circuit die and extending on top surfaces of the conductive feature and the encapsulant, wherein the polymer material comprises a plurality of dielectric filler particles, wherein a top surface, interior sidewall surfaces, and exposed sidewall surfaces of the polymer material comprise a plurality of pits, and wherein a bottom surface of the polymer material comprises a plurality of pits; and
a solder material extending through the polymer material, wherein the solder material is electrically connected to the conductive feature, wherein sidewall surfaces of the solder material comprise a plurality of protrusions that protrude into the polymer material at the interior sidewall surfaces.

2. The device of claim 1, wherein the top surface of the polymer material has a roughness in the range of 0.1 µm to 10 µm.

3. The device of claim 1, further comprising a package component attached to the solder material, wherein an underfill extends between the polymer material and the package component.

4. The device of claim 3, wherein the underfill fills the plurality of pits that are disposed in the top surface of the polymer material.

5. The device of claim 1, wherein the polymer material has a Young's modulus between 10 GPa and 50 GPa.

6. The device of claim 1 further comprising a metallization pattern between the conductive feature and the polymer material, wherein the metallization pattern is electrically connected to the conductive feature and to the solder material.

7. The device of claim 1, wherein an exposed sidewall of the polymer material and a sidewall of the encapsulant are coterminous.

8. The device of claim 1, wherein a pitted top surface of the polymer material is exposed.

9. The device of claim 1, wherein the polymer material physically contacts the top surfaces of the conductive feature and the encapsulant.

10. A device comprising:
a first package structure comprising:
a redistribution structure;
a plurality of through vias connected to the redistribution structure;
a composite layer over the through vias, wherein the composite layer comprises a filler material in a base material, wherein a top surface of the composite layer comprises a plurality of recesses, wherein a bottom surface of the composite layer comprises a plurality of recesses; and
a plurality of first connectors within the composite layer, wherein each through via of the plurality of through vias is connected to a respective first connector of the plurality of first connectors;
a second package structure attached to the first package structure, wherein the second package structure comprises a plurality of second connectors, wherein each second connector of the plurality of second connectors is connected to a respective first connector of the plurality of first connectors; and
an underfill material extending between the first package structure and the second package structure, wherein the underfill material fills recesses of the plurality of recesses in the top surface of the composite layer.

11. The device of claim 10, wherein the plurality of first connectors comprise a solder material.

12. The device of claim 10, wherein a portion of the top surface of the composite layer is exposed.

13. The device of claim 10, wherein a sidewall surface of the composite layer comprises a plurality of recesses.

14. The device of claim 13, wherein a first connector of the plurality of first connectors fills recesses of the plurality of recesses in the sidewall surface of the composite layer.

15. The device of claim 10, wherein the composite layer physically contacts the plurality of through vias.

16. The device of claim 10 further comprising a molding material encapsulating the plurality of through vias, wherein the composite layer physically contacts the molding material.

17. A method comprising:
attaching a die to a first side of a composite layer, wherein the composite layer comprises filler particles, wherein a surface of a first side of the composite layer is pitted;
forming a through via on the first side of the composite layer;
depositing a molding material over the first side of the composite layer to encapsulate the die and the through via;
forming a redistribution structure extending over the molding material, the die, and the through via, wherein the redistribution structure is electrically connected to the die and the through via; and
forming a conductive material extending through the composite layer, wherein the conductive material is electrically connected to the through via.

18. The method of claim 17, wherein the surface of a second side of the composite layer is pitted.

19. The method of claim 17, wherein the conductive material comprises solder.

20. The method of claim 17 further comprising attaching a package component to the conductive material.

* * * * *